(12) United States Patent
Moll et al.

(10) Patent No.: US 7,069,488 B2
(45) Date of Patent: Jun. 27, 2006

(54) SIGNAL SAMPLING WITH SAMPLING AND REFERENCE PATHS

(75) Inventors: Joachim Moll, Herrenberg (DE); Thomas Burger, Gerstetten (DE)

(73) Assignee: Agilent Technologies, Inc., Palo Alto, CA (US)

( * ) Notice: Subject to any disclaimer, the term of this patent is extended or adjusted under 35 U.S.C. 154(b) by 280 days.

(21) Appl. No.: 10/464,185

(22) Filed: Jun. 18, 2003

(65) Prior Publication Data

US 2004/0039552 A1  Feb. 26, 2004

(30) Foreign Application Priority Data

Jul. 25, 2002 (EP) .................................. 02016599
Aug. 2, 2002 (EP) .................................. 02017333

(51) Int. Cl.
*G06F 11/00* (2006.01)
(52) U.S. Cl. ....................................... 714/736; 714/704
(58) Field of Classification Search ..................... None
See application file for complete search history.

(56) References Cited

U.S. PATENT DOCUMENTS

| 3,985,956 A | * | 10/1976 | Monti et al. ................. 704/236 |
| 5,987,634 A | * | 11/1999 | Behrens et al. ............. 714/719 |
| 6,751,566 B1 | * | 6/2004 | Sugai ........................... 702/70 |
| 2004/0027262 A1 | * | 2/2004 | Cloetens ..................... 341/123 |

FOREIGN PATENT DOCUMENTS

EP  1 106 632  6/2001

* cited by examiner

*Primary Examiner*—Christine T. Tu

(57) ABSTRACT

A signal-analyzing unit has a sampling path and a reference path both receiving a digital test signal. The sampling path has a first comparator for comparing the test signal against a first threshold value and providing a first comparison signal, and a first sampling device receiving as input the first comparison signal and a first timing signal. The reference path has a second comparator for comparing the test signal against a second threshold value and providing a second comparison signal, and a second sampling device for receiving as input the second comparison signal and a second timing signal. An analysis unit receives and analyzes the output of the sampling and reference paths.

16 Claims, 1 Drawing Sheet

SIGNAL SAMPLING WITH SAMPLING AND REFERENCE PATHS

BACKGROUND OF THE INVENTION

The present invention relates to the characterization of transient behavior of digital signals.

Characterizing the transient behavior of digital signals, i.e. the transition from logical zero to logical one, and vice versa, has become increasing important for designing as well as manufacturing such digital circuits, and is disclosed e.g. in the European Patent application No. 01106632.1, the teaching thereof shall be incorporated herein be reference. For testing a device under test (DUT), usually one or multiple stimulus signals are applied to the DUT and one or multiple response signals onto the stimulus signals are detected and analyzed (e.g. by comparing the detected response signal with an expected response signal).

A standard characterization of digital circuits requires determining the so-called Bit Error Rate (BER), i.e. the ratio of erroneous digital signals (Bits) to the total number of regarded digital signals. Bit Error Rate Testers (BERTs), such as the Agilent® 81250 ParBERT Platform with and Agilent® E4875A User Software and Measurement Software both by the applicant Agilent Technologies, are provided to determine a so-called BER eye diagram as a two-dimensional graphical representation generated using a sweep over delay and threshold of an analyzer. The result is an eye pattern with a BER value dependent on the sampling point for a plurality of sampling points.

Each sampling point is determined by a relative (e.g. delay) time with respect to corresponding transition of a clock signal (usually the system clock for generating the stimulus signals or a clock signal derived therefrom or from the response signal) and a threshold value for comparing the response signal with. The maximum number of sampling points is usually dependent on the resolution of the analyzer. In order to decrease measurement time, the number of sampling points is usually kept as low as possible. The BER eye diagram gives information which BER value can be expected depending on the position of the sampling point within the eye. Parameters like jitter, level noise, phase margin, and quality factor (Q-factor) can be calculated from the BER eye diagram.

SUMMARY OF THE INVENTION

It is an object of the present invention to provide an improved transient testing. The object is solved by the independent claims. Preferred embodiments are shown by the dependent claims.

According to the present invention, a signal-analyzing unit for analyzing a digital test signal (as provided e.g. from a DUT) comprises a sampling path and a reference path, both receiving the test signal, and an analysis unit adapted for receiving and jointly analyzing the output of both of the sampling and reference path.

The sampling path comprises a first comparator for comparing the test signal against a first threshold value (e.g. a threshold voltage) and providing a first comparison signal as result of the comparison. A first sampling device receives as input the first comparison signal together with a first timing signal comprising a plurality of successive first timing marks. The first sampling device is adapted to derive a value of the first comparison signal for one or more (and preferably each) of the first timing marks. The sampling device provides as an output a first sampling signal representing the derived value(s) of the first comparison signal over or in relation to the respective first timing mark(s).

The reference path comprises a second comparator for comparing the test signal against a second threshold value (e.g. a threshold voltage) and providing a second comparison signal as result of the comparison. A second sampling device receives as input the second comparison signal together with a second timing signal comprising a plurality of successive second timing marks. The second sampling device is adapted to derive a value of the second comparison signal for one or more (and preferably each) of the second timing marks. The sampling device provides as an output a second sampling signal representing the derived value(s) of the second comparison signal over or in relation to the respective second timing mark(s).

The first and the second timing signals are provided having a defined relationship to each other, so that there also is a defined relationship between corresponding ones of the first and second timing marks. Preferably, the first and the second timing signals are both derived from a (common) clock signal. One or more appropriate timing units might be provided for generating the respective timing signal(s) comprising the timing marks from the clock signal.

The analysis unit receives the first and second sampling signals from the first and the second sampling devices as well as the first and second timing signals. The analysis unit provides a joint analysis of the outputs from the first and second sampling signals, thereby using knowledge about the respective first and second timing signals together with the first and second threshold values.

In one embodiment, the second threshold voltage together with the second timing signal are provided in order to derive a secure detection (i.e. to minimize measuring uncertainty) of respective states in the test signal. Preferably, the second threshold voltage and the second timing signal are provided to sample the test signal substantially in the middle of an eye diagram derived for the test signal. Preferably, the second threshold voltage is selected to be substantially half of the difference in voltage between a high and a low state of the test signal. Preferably, the timing marks in the second timing signal are provided to be substantially in the middle between two transitions of the same direction (either a rising or a falling edge) of the second timing signal. Preferably, the timing marks of the second timing signal are delayed by half a period of a signal clock associated with the test signal with respect to either the rising or falling edges of at least one of the signal clock or the test signal.

While the sampling of the reference path is preferably provided to achieve a secure detection of states in the test signal, the sampling points in the sampling path are preferably varied in order to fully or partly analyzed the behavior of the test signal.

In one embodiment, each of the first and the second comparators compares the test signal against a respective threshold value (the first or the second threshold value) and provides as comparison signal a first value in case the test signal is greater than the threshold value and a second value in case the test signal is smaller than the threshold value.

In one embodiment, only one comparator is provided instead of the first and the second comparators. The one comparator receives as input the test signal and compares the test signal against one threshold value and provides a comparison signal therefrom. The comparison signal is then provided as input to the sampling device as well as to the phase control unit. Providing two independent comparators and threshold values, however, allows to independently varying the respective threshold values. This might be of advantage in order to safely derive the second sampling signal from the test signal, while still allowing the sampling device to sample at each possible threshold value (as determined by the first threshold value together with the first comparator).

In one embodiment, the analysis unit uses the output of the reference path for comparing it with the output of the sampling path. The comparison can be made directly or indirectly. In the former case (direct comparison), corresponding samples determined by the first and second sampling devices are directly compared with each other. In other words, the output of the reference path is regarded as representing the expected response signal while the output of the first sampling device represents the detected response signal. A deviation in the corresponding samples indicates an error. Corresponding samples means that both samples are detected within one period of the signal clock. Preferably, the analysis unit compares the first and second sampling signals for corresponding sampling points.

In the latter case (i.e. indirect comparison) the analysis unit has knowledge about the expected response signal in principle, however, permitted deviations and variations in the expected response signal might occur e.g. resulting from data protocols like 10-Gigabit-Ethernet (10 GbE) or XAUI. For example, a protocol might allow inserting an unknown number of idle cells between data words resulting e.g. from small frequency differences between the inputs and the outputs of such a device. If the output data rate exceeds the input data rate, the device will insert idle cells in order to adjust for that difference. If the output data rate is smaller than the input data rate it will remove idle cells. Further, scrambling might be used to remove long runs of equal bits in data stream. The start phase of a scrambler influences the scrambled data stream, and as it is often unknown the scrambled data content cannot be predetermined. That means, that a course of the expected response signal can only be known in principle, but some variations are allowed. Without considering such "allowed variations" actual response signals, which are compliant with such protocol and without showing bit errors, might be tested to contain errors since the "static" expected response signal (i.e. without consideration of the permitted variations) and the actual expected response signal do not coincide.

In such case of indirect comparison, the output of the second sampling device is used to generate the expected response signal from the expected response signal known in principle in combination with the output of the second sampling device. This can be achieved e.g. by detecting patterns of the output of the second sampling device in the expected response signal known in principle. Thus, e.g. idle cells can be detected and the actually expected response signal can be generated.

In an embodiment, the data stream is decoded or descrambled and afterwards the position and type of control characters or idle cells is detected. These control characters and idle cells are then inserted into the raw expected data signal. Afterwards the coding or scrambling is performed with the start phase of the scrambler being detected in the received data stream.

In one embodiment, the signal-analyzing unit further comprises a clock recovery unit also receiving the test signal. The clock recovery unit receives the test signal and derives therefrom a generated clock signal. The generated clock signal might further be provided to the one or more timing unit(s) for generating the timing signal comprising the timing marks (as applied by the sampling devices). The clock recovery unit can preferably be embodied as disclosed in the European Patent Application No. 02016599.9, the teaching thereof shall be incorporated herein by reference.

In one embodiment, the clock recovery unit comprises a third comparator for comparing the test signal against a third threshold value and for providing a third comparison signal as result of the comparison. However, instead of the third comparator, the clock recovery unit might also receive the second comparison signal from the second comparator.

In one embodiment, the clock recovery unit further comprises a clock generator and a phase control unit. The clock generator generates the clock signal having substantially the same frequency as a signal clock associated with the test signal. In a further embodiment, wherein the clock generator is tunable in frequency, the clock recovery unit further comprises a frequency correction unit for substantially adjusting the frequency of the clock generator to the frequency of the signal clock.

The phase control unit receives the respective comparison signal (from the second or third comparator) as well as the clock signal (generated by the clock generator) and determines a difference in the phases there-between. The phase control unit controls the clock generator in order to minimize deviations in phase between the generated clock signal and the comparison signal. In another embodiment, the clock signal is derived by converting the second comparison signal into a return-to-zero (RZ) signal and feeding this signal to a filter (preferably band-pass or notch filter) to extract the clock signal. Other schemes as known in the art for deriving the clock signal from the test signal can be applied accordingly.

The generated clock signal is preferably further provided as the clock signal to the timing unit for generating the timing marks. Each timing unit preferably derives the timing marks from transitions in the clock signal (preferably from either one of a rising or falling edges). Each timing unit might preferably further allow modifying the timing marks with respect to corresponding transitions in the clock signal. Preferably, the timing marks can be delayed with respect to corresponding transitions. This can be achieved e.g. by a phase shift or delay unit receiving the clock signal and being adapted to (preferably variably) shift the phase of the clock signal and provide the phase shifted clock signal to the sampling device. This allows delaying the timing marks with respect to the transitions of the clock signal.

Instead of using the clock recovery another clock source having substantially the same frequency as the test signal can be used, e.g. the user can apply an externally generated clock, e.g. the clock used to drive the DUT.

It is clear that the digital test signal may also be a differential signal. In that case preferably a level-shifting unit as disclosed in the European Patent application No. 02015432.4 is applied. The teaching of that document, in particular with respect to the level-shifting unit, shall be incorporated herein by reference.

The invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawing.

DETAILED DESCRIPTION OF PREFERRED EMBODIMENTS ACCORDING TO THE INVENTION

Figure 1:
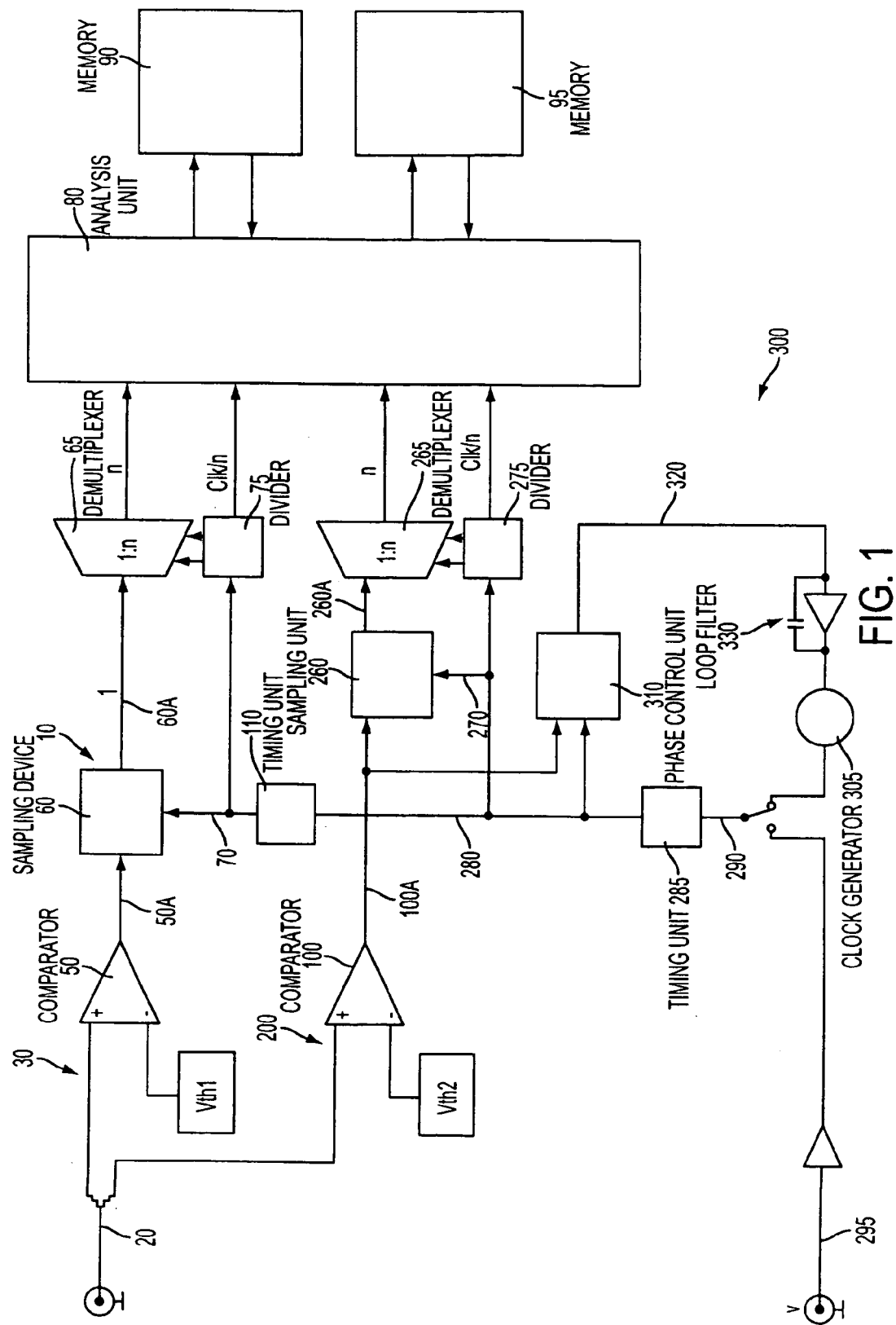
FIG. 1 shows an example of an embodiment according to the present invention.

In FIG. 1, a signal-analyzing unit 10 for analyzing a digital test signal 20 (as provided e.g. from a DUT) comprises a sampling path 30 and a reference path 200, both receiving the test signal 20, and an analysis unit 80 adapted for receiving and jointly analyzing the output of both of the sampling 30 and reference 200 path.

The sampling path 30 comprises a first comparator 50 for comparing the test signal 20 against a first threshold value (Vth1) and providing a first comparison signal 50A as result of the comparison. The first comparator 50 provides as the comparison signal 50A a first value (preferably a HIGH signal) in case the test signal is greater than the threshold value and a second value (preferably a LOW signal) in case the test signal is smaller than the threshold value.

A first sampling device 60 receives as input the first comparison signal 50A together with a first timing signal 70 comprising a plurality of successive timing marks. The first sampling device 60 is adapted to derive a value of the first comparison signal for one or more (and preferably each) of the first timing marks. The first sampling device 60 provides as an output a first sampling signal 60A representing the derived value(s) of the first comparison signal 50A over the respective timing mark(s).

The reference path 200 comprises a second comparator 100 for comparing the test signal 20 against a second threshold value (Vth2) and providing a second comparison signal 100A as result of the comparison. The second comparator 100 provides as the second comparison signal 100A the first value in case the test signal is greater than the threshold value and the second value in case the test signal is smaller than the threshold value.

A second sampling device 260 receives as input the second comparison signal 100A together with a second timing signal 270 comprising a plurality of successive timing marks. The second sampling device 260 is adapted to derive a value of the second comparison signal for one or more (and preferably each) of the second timing marks. The second sampling device 260 provides as an output a second sampling signal 260A representing the derived value(s) of the second comparison signal 100A over the respective timing mark(s).

The first and second sampling signals 60A and 260A are then subject (directly or after further processing) to further analysis by an analysis unit 80 (e.g. for comparing the sampling signal 60A with an expected response signal, which might be stored in a memory 90). Further, the analysis unit 80 might store the sampling signal 60A or 260A (e.g. for later analysis in a memory 95).

Optionally, demultiplexers 65 and 265 and dividers 75 and 275 might be coupled before the inputs of the analysis unit 80 in order to decrease the data rate of the received signal. Often the BER-logic is implemented in lower speed digital circuits, e.g. FPGA's, and thus the high-speed data stream is broken up into several lower speed signals. This procedure is called demultiplexing or deserializing and is done with the demultiplexers 65, 265. The dividers 75, 275 control the demultiplexers 65, 265 and deliver a lower speed clock to the analysis unit 80.

The first and the second timing signals 70, 270 are provided having a defined relationship to each other, so that there also is a defined relationship between corresponding ones of the first and second timing marks. In the example of FIG. 1, the first and the second timing signals 70, 270 are both derived from a (common) clock signal 280. One or more appropriate timing units might be provided for generating the respective timing signal(s) comprising the timing marks from the clock signal 280. In the example here, a first timing unit 110 generates the first timing signals from the clock signal 280, while the clock signal 280 is directly fed as the second timing signal 270. However, the clock signal 280 is generated by a second timing unit 285 from an initial clock signal 290. The initial clock signal can be selected from a provided clock source (e.g. the signal clock of the test signal) or a clock signal generated by an optional clock recovery unit 300 as explained later. Each timing unit derives the timing marks from transitions in its received clock signal (preferably from either one of a rising or falling edges), and might further allow modifying the timing marks with respect to corresponding transitions in its received clock signal by controllably delaying the timing marks with respect to corresponding transitions.

The analysis unit 80 receives the first and second sampling signals 60A, 260A as well as the first and second timing signals 70, 270. The analysis unit 80 provides a joint analysis of the first and second sampling signals 60A, 260A, thereby using knowledge about the respective first and second timing signals 70, 270 together with the first and second threshold values Vth1, Vth2.

In this embodiment, the second threshold voltage and the second timing signal are provided to sample the test signal substantially in the middle of an eye diagram derived for the test signal. The second threshold voltage is selected to be substantially in the middle between a high and a low state of the test signal. The timing marks of the second timing signal 270 are either set by the clock recovery loop to be in the middle of the data period or it can be delayed with delay unit 285 to be in the middle of the data period if external clock is used. Thus the sampling of the reference path is preferably provided to achieve a secure detection of states in the test signal, while the sampling points in the sampling path can be varied in order to fully or partly analyzed the behavior of the test signal.

The analysis unit compares the first and the second sampling signals 60A, 260A either directly or indirectly. For direct comparison, corresponding samples determined by the first and second sampling devices are directly compared with each other, whereby the output of the reference path is regarded as representing the expected response signal.

For indirect comparison, the analysis unit 80 has knowledge about the expected response signal in principle, however, permitted deviations and variations in the expected response signal might occur e.g. resulting from data protocols. The analysis unit 80 uses the output 260A of the second sampling device 260 together with the expected response signal known in principle (stored in memory 90) to generate the expected response signal. The analysis unit 80 preferably detects patterns of the output 260A in the expected response signal known in principle. Thus, e.g. idle cells can be detected and the actually expected response signal can be generated.

The usage of reference path (260A) and test signal path (60A) can be exchanged within the analysis unit (80).

The optional clock recovery unit 300 shall now be further illustrated. The clock recovery unit 300, in the example here, comprises a clock generator 305 and a phase control unit 310. The clock generator 305 generates a clock signal 305A having substantially the same frequency as a signal clock associated with the test signal 20. The phase control unit 310 receives the second comparison signal 100A as well as the clock signal 305A and determines a difference in the phases there-between. An output 320 of the phase control unit controls the clock generator 305 in order to minimize deviations in phase between the generated clock signal 305A and the second comparison signal 100A. A loop filter 330, e.g. as the example shown in FIG. 1, can be inserted to stabilize the response of the loop and prevent the loop from oscillating.

Varying the first threshold value Vth1 allows the sampling device 60 to sample at each possible threshold value. Varying the relative (e.g. delay) time of the timing marks with respect to corresponding transitions of the clock signal 280 or 290 then allows to further analyze the test signal 20 along its time axes. Thus e.g. an eye diagram of the test signal 20 can be determined.

What is claimed is:

1. A signal-analyzing unit adapted for analyzing a digital test signal, comprising:
    a sampling path for receiving the test signal and comprising:
        a first comparator for comparing the test signal against a first threshold value and providing a first comparison signal as result of the comparison, and
        a first sampling device for receiving as input the first comparison signal together with a first timing signal comprising a plurality of successive first timing marks, wherein the first sampling device derives a value of the first comparison signal for one or more of the first timing marks;
    a reference path for receiving the test signal and comprising:
        a second comparator for comparing the test signal against a second threshold value and providing a second comparison signal as result of the comparison, and
        a second sampling device for receiving as input the second comparison signal together with a second timing signal comprising a plurality of successive second timing marks, wherein the second sampling device is to derive a value of the second comparison signal for one or more of the second timing marks; and
    an analysis unit for receiving and jointly analyzing the output of both of the sampling and reference path.

2. The signal-analyzing unit of claim 1, wherein:
    the first sampling device provides as an output a first sampling signal representing one or more derived values of the first comparison signal over or in relation to one or more respective first timing marks, and
    the second sampling device provides as an output a second sampling signal representing one or more derived values of the second comparison signal over or in relation to one or more respective second timing marks.

3. The signal-analyzing unit of claim 2, wherein the first and the second timing signals are provided having a defined relationship to each other, so that there also is a defined relationship between corresponding ones of the first and second timing marks.

4. The signal-analyzing unit of claim 2, wherein the first and the second timing signals are derived from a clock signal.

5. The signal-analyzing unit of claim 1, wherein the analysis unit uses for the joint analysis knowledge about the output of both of the sampling and reference path together with the first and second threshold values.

6. The signal-analyzing unit of claim 1, wherein the second threshold voltage together with the second timing signal are provided in order to derive a secure detection of respective states in the test signal, and the first threshold voltage together with the first timing signal are varied in order to fully or partly analyze the behavior of the test signal.

7. The signal-analyzing unit of claim 1,
    wherein the first comparison signal is a first value when the test signal is greater than the first threshold value and a second value when the test signal is smaller than the first threshold value, and
    wherein the second comparison signal is the first value when the test signal is greater than the second threshold value and the second value when the test signal is smaller than the second threshold value.

8. The signal-analyzing unit of claim 1, wherein the analysis unit uses the output of the reference path for comparing it with the output of the sampling path.

9. The signal-analyzing unit of claim 8, wherein the analysis unit provides a direct comparison by directly comparing with each other corresponding samples determined by the first and second sampling devices.

10. The signal-analyzing unit of claim 8, wherein the test signal deviates to a certain extend from an expected test signal known in principle without representing an error, with such deviation resulting from at least one of a data protocol or scrambling, and wherein the analysis unit generates an expected test signal from the expected test signal known in principle in combination with the output of the second sampling device for directly comparing the expected test signal with the output of the sampling path.

11. The signal-analyzing unit of claim 10, wherein the analysis unit generates the expected test signal by detecting patterns of the output of the second sampling device in the expected test signal known in principle.

12. The signal-analyzing unit of claim 1, further comprising a clock recovery unit adapted for receiving the test signal and deriving therefrom at least one of the first and second timing marks.

13. The signal-analyzing unit of claim 1, wherein the analysis unit determines a value of bit error rate for the test signal from a first sampling signal derived from the first comparison signal and from a second sampling signal derived from the second comparison signal.

14. A method for analyzing a digital test signal, comprising the steps of:
    (a) comparing the test signal against a first threshold value and providing a first comparison signal as result of the comparison,
    (b) receiving as input the first comparison signal together with a first timing signal comprising a plurality of successive first timing marks, and deriving a value of the first comparison signal for one or more of the first timing marks,
    (c) comparing the test signal against a second threshold value and providing a second comparison signal as result of the comparison,
    (d) receiving as input the second comparison signal together with a second timing signal comprising a plurality of successive second timing marks, and deriving a value of the second comparison signal for one or more of the second timing marks, and (e) comparing the value of the first comparison signal for one or more of the first timing marks with the value of the second comparison signal for one or more of the second timing marks.

15. The method of claim 14, wherein the step e comprises a step of directly comparing corresponding samples determined in steps b and d.

16. The method of claim 14, wherein the test signal deviates to a certain extend from an expected test signal known in principle without representing an error, with such deviation resulting from at least one of a data protocol or scrambling, and wherein the step e comprises a steps of generating an expected test signal from the expected test signal known in principle in combination with the output of the second sampling device, and directly comparing the expected test signal with the output of the sampling path.

* * * * *